(12) United States Patent
Song et al.

(10) Patent No.: US 7,598,115 B2
(45) Date of Patent: Oct. 6, 2009

(54) METHOD OF FABRICATING ORGANIC LIGHT EMITTING DISPLAY

(75) Inventors: Myung-Won Song, Suwon-si (KR); Seong-Taek Lee, Suwon-si (KR); Byung-Doo Chin, Suwon-si (KR); Tae-Min Kang, Suwon-si (KR); Jae-Ho Lee, Suwon-si (KR); Mu-Hyun Kim, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 455 days.

(21) Appl. No.: 11/214,059

(22) Filed: Aug. 30, 2005

(65) Prior Publication Data

US 2006/0068520 A1 Mar. 30, 2006

(30) Foreign Application Priority Data

Aug. 30, 2004 (KR) ...................... 10-2004-0068757

(51) Int. Cl.
*H01L 51/40* (2006.01)
(52) U.S. Cl. ................... 438/99; 257/E21.024; 438/34; 438/458
(58) Field of Classification Search ............... 438/34, 438/99, 458; 257/E21.024
See application file for complete search history.

(56) References Cited

U.S. PATENT DOCUMENTS

| 5,556,806 | A | 9/1996 | Pan et al. |
| 6,153,523 | A | 11/2000 | Van Ngo et al. |
| 2002/0149315 | A1* | 10/2002 | Blanchet-Fincher ........ 313/504 |
| 2003/0008224 | A1 | 1/2003 | Fujita et al. |
| 2003/0124265 | A1 | 7/2003 | Bellmann et al. |
| 2005/0116621 | A1* | 6/2005 | Bellmann et al. ........... 313/503 |

FOREIGN PATENT DOCUMENTS

| JP | 02-253988 | 10/1990 |
| JP | 07-007134 | 10/1995 |
| JP | H11-204518 | 7/1999 |
| JP | 2003-158194 | 5/2003 |
| JP | 2004-510289 | 4/2004 |
| KR | 2002-0026555 | 4/2002 |
| KR | 2002-0064302 | 8/2002 |

(Continued)

OTHER PUBLICATIONS

European Office Action of the European Patent Application No. 05107828.5, mailed on Nov. 24, 2005.

(Continued)

*Primary Examiner*—Asok K Sarkar
(74) *Attorney, Agent, or Firm*—Robert E. Bushnell, Esq.

(57) ABSTRACT

A method of fabricating a donor substrate for a laser induced thermal imaging (LITI) process. A base substrate is prepared. A light-to-heat conversion layer is formed on the base substrate. A buffer layer is formed on the light-to-heat conversion layer. The surface roughness of the buffer layer is increased by treating the surface of the buffer layer. A transfer layer is formed on the surface-treated buffer layer. By using the donor substrate, a patterning process can be performed better during the fabrication of the OLED.

13 Claims, 3 Drawing Sheets

FOREIGN PATENT DOCUMENTS

| WO | 02/070271 A2 | 9/2002 |
|---|---|---|
| WO | WO 02/087894 | 11/2002 |
| WO | WO 03/017731 | 2/2003 |
| WO | WO 03/047872 | 6/2003 |

OTHER PUBLICATIONS

European Search Report corresponding to European Patent Application No. 05107828.5-1235, issued on Feb. 14, 2007.

"*Surface treatment and characterization of PMMA, PHEMA, and PHPMA*" by Lim, et al. Journal of Vacuum Science and Technology: American Vacuum Society; vol. A19, No. 4, Jul. 1, 2001.

Korean Office Action of the Korean Patent Application No. 10-2004-0068757, mailed on Feb. 20, 2006.

Japanese Office Action issued on Nov. 27, 2007, corresponding to Japanese Patent Application No. 2004-366723.

Office action from the Chinese Patent Office issued in Applicant's corresponding Chinese Patent Application No. 2005100996085 dated Feb. 15, 2008, along with an English language translation.

Office action from Japanese Patent Office issued in Applicant's corresponding Japanese Patent Application No. 2004-366723 on Jul. 15, 2008.

Japanese Office Action dated Nov. 25, 2008 in the corresponding Japanese Patent Application No. 2004-366723.

\* cited by examiner

US 7,598,115 B2

METHOD OF FABRICATING ORGANIC LIGHT EMITTING DISPLAY

CLAIM OF PRIORITY

This application claims priority to and the benefit of Korean Patent Application No. 2004-68757, filed Aug. 30, 2004, the disclosure of which is incorporated herein by reference in its entirety.

BACKGROUND OF THE INVENTION

1. Field of the Invention

The present invention relates to a method of fabricating an organic light emitting display (OLED) and, more particularly, to a method of fabricating an OLED using a donor substrate having a surface-treated buffer layer.

2. Description of the Related Art

Among flat panel displays (FPDs), an organic light emitting display (OLED) is quite appropriate for a medium that displays moving images irrespective of its sizes because the OLED has a fast response speed of 1 millisecond or less and a wide viewing angle, consumes low power, and is an emissive display. Also, the OLED can be fabricated at low temperature and in a simple process based on a conventional semiconductor manufacturing technology. For these reasons, the OLED has attracted much attention as the next-generation flat panel display (FPD).

The OLED can largely be classified into a polymer type using a wet process and a small-molecule type using a deposition process, according to the types of material and process used for an organic light emitting device. If an emission layer (EML) is formed of a small-molecule material, it is deposited in vacuum using a shadow mask. If the EML is formed of a polymer material, it is formed by an inkjet printing method. However, it is difficult to perform the vacuum deposition process using the shadow mask on a large-sized substrate. Also, since the inkjet printing method is a wet process, an underlying layer should be formed of only limited kinds of materials, and a bank structure should definitely be formed on a substrate.

As a substitute for the above-described methods of patterning the EML, a laser-induced thermal imaging (LITI) process has recently been developed.

During the LITI process, a pattern is formed by transferring a pattern forming material to a target substrate using laser beams irradiated from a light source. Such an LITI process requires a donor substrate on which a transfer layer is formed, a light source, and an acceptor substrate.

The donor substrate includes a base substrate, a light-to-heat conversion layer, and a transfer layer. During a transfer process using the donor substrate, laser beams are irradiated on a predetermined region of the base substrate and then converted into heat by the light-to-heat conversion layer. The heat transforms adhesion properties between the transfer layer and the light-to-heat conversion layer so that the transfer layer is transferred to the acceptor substrate.

Accordingly, the performance of the donor substrate depends on adhesion properties between the donor substrate and the transfer layer, and a poor adhesion between the transfer layer and the light-to-heat conversion layer may cause failures during the process of transferring the transfer layer to the acceptor substrate.

SUMMARY OF THE INVENTION

It is therefore an object of the present invention to solve aforementioned problems associated with conventional displays.

It is also an object of the present invention to provide a method of fabricating an organic light emitting display (OLED) using a donor substrate, in which adhesion properties between the donor substrate and the transfer layer are enhanced and a patterning process can be performed better during the fabrication of the OLED by interposing a buffer layer between a transfer layer and a light-to-heat conversion layer and then surface-treating the buffer layer.

It is still an object of the present invention to provide an improved method of transferring a pattern forming material to a target substrate.

According to an aspect of the present invention, a method of fabricating a donor substrate for a laser induced thermal imaging (LITI) process includes: preparing a base substrate of a donor substrate; forming a light-to-heat conversion layer on the base substrate; forming a buffer layer on the light-to-heat conversion layer; increasing the surface roughness of the buffer layer by treating the surface of the buffer layer; and forming a transfer layer on the surface-treated buffer layer.

According to an aspect of the present invention, a method of transferring a pattern forming material to a target substrate includes: preparing a donor substrate by a process comprising preparing a base substrate, forming a light-to-heat conversion layer on the base substrate, forming a buffer layer on the light-to-heat conversion layer, increasing surface roughness of the buffer layer, and forming a transfer layer on the surface-treated buffer layer; irradiating laser beams on a predetermined region of the donor substrate, the laser beams converted into heat by the light-to-heat conversion layer to transform adhesion properties between the transfer layer and the light-to-heat conversion layer; and transferring the transfer layer to the target substrate.

According to still an aspect of the present invention, a method of transferring a pattern forming material to a target substrate includes: preparing a donor substrate, the donor substrate constructed with a transfer layer, a light-to-heat conversion layer, and a surface-treated buffer layer interposed between the transfer layer and the light-to-heat conversion layer; irradiating laser beams on a predetermined region of the donor substrate, the laser beams converted into heat by the light-to-heat conversion layer to transform adhesion properties between the transfer layer and the light-to-heat conversion layer; and transferring the transfer layer to the target substrate.

The surface treatment of the buffer layer may be performed using oxygen ions or radical-based gases.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1A:
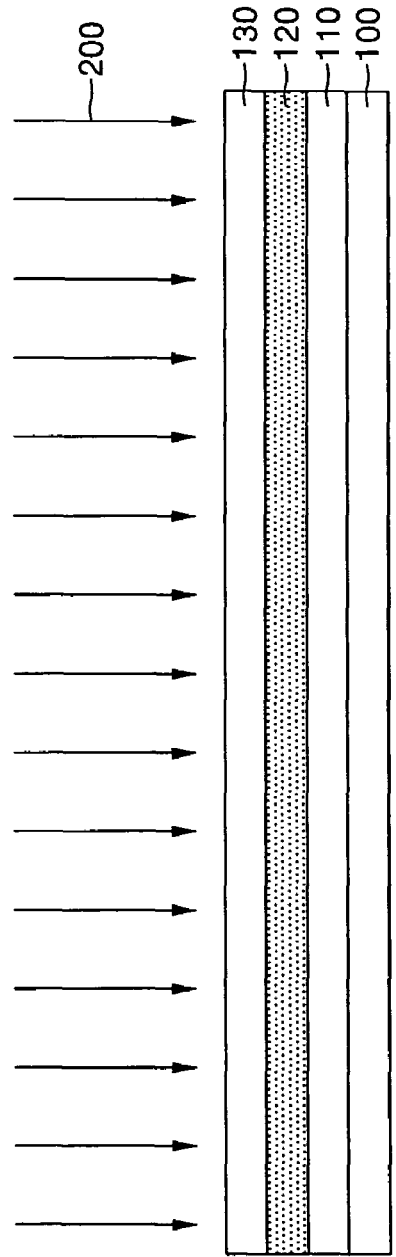
FIGS. 1A and 1B are cross-sectional views illustrating a method of fabricating a donor substrate for a laser induced thermal imaging (LITI) process according to an exemplary embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. The thicknesses of layers or regions shown in the drawings are exaggerated for clarity. The same reference numerals are used to denote the same elements throughout the specification.

Figure 1B:
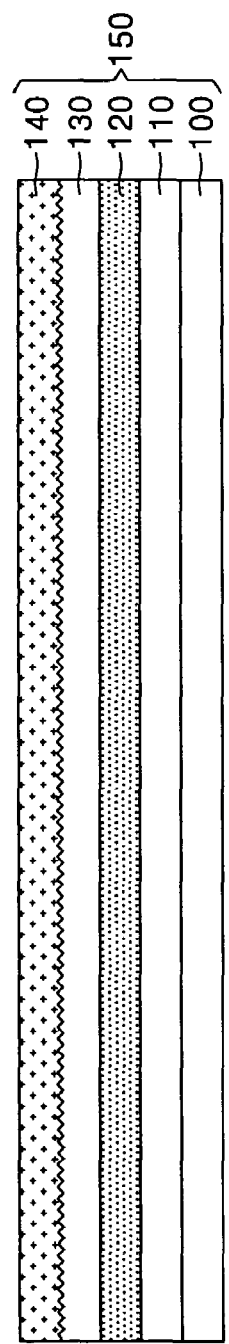

FIGS. 1A and 1B are cross-sectional views illustrating a method of a donor substrate for a laser induced thermal imaging (LITI) process according to an exemplary embodiment of the present invention.

Referring to FIG. 1A, a base substrate 100 is prepared. The base substrate 100 may be a flexible substrate such as a plastic film, or a hard substrate such as a glass substrate.

A light-to-heat conversion layer 120 is formed on the base substrate 100.

Before the light-to-heat conversion layer 120 is formed, a primer layer 110 may be formed on the base substrate 100.

The primer layer 110 may be used to reinforce an adhesion between the base substrate 100 and the light-to-heat conversion layer 120. Also, the primer layer 110 may be used to treat the surface of the base substrate 100 and thus, assist in forming the light-to-heat conversion layer 120 with improved uniformity.

The light-to-heat conversion layer 120 is formed of a light absorption material that absorbs light in the infrared and visible regions. Also, the light-to-heat conversion layer 120 may be formed of an organic layer containing a material that absorbs laser beams, a metal layer, or a combination thereof.

The light-to-heat conversion layer 120 converts laser beams irradiated from a laser irradiating system into thermal energy. Then, the thermal energy transforms adhesion properties between the transfer layer 140 and the light-to-heat conversion layer 120. Thus, a region of the transfer layer 140 on which the laser beams are irradiated is transferred to a substrate as a subject, so that a patterning process is performed.

A buffer layer 130 is formed on the light-to-heat conversion layer 120. The buffer layer 130 prevents a transfer material from being damaged and effectively controls an adhesion between the transfer layer 140 and the donor substrate.

The buffer layer 130 may be formed of an organic or inorganic material, which is a polymer, a metal, or metal oxide.

The surface of the buffer layer 130 is treated to increase its surface roughness. In this case, the surface treatment of the buffer layer 130 may be performed, preferably using oxygen ions or radical-based gases 200.

Figure 2A:
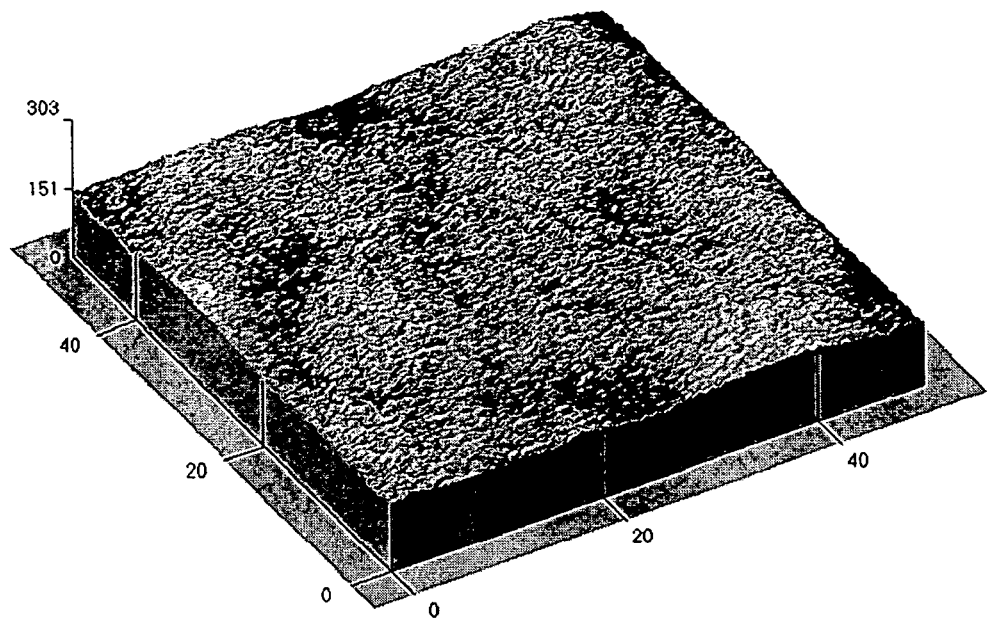
FIG. 2A is a photograph of the surface after forming a buffer layer.
Figure 2B:
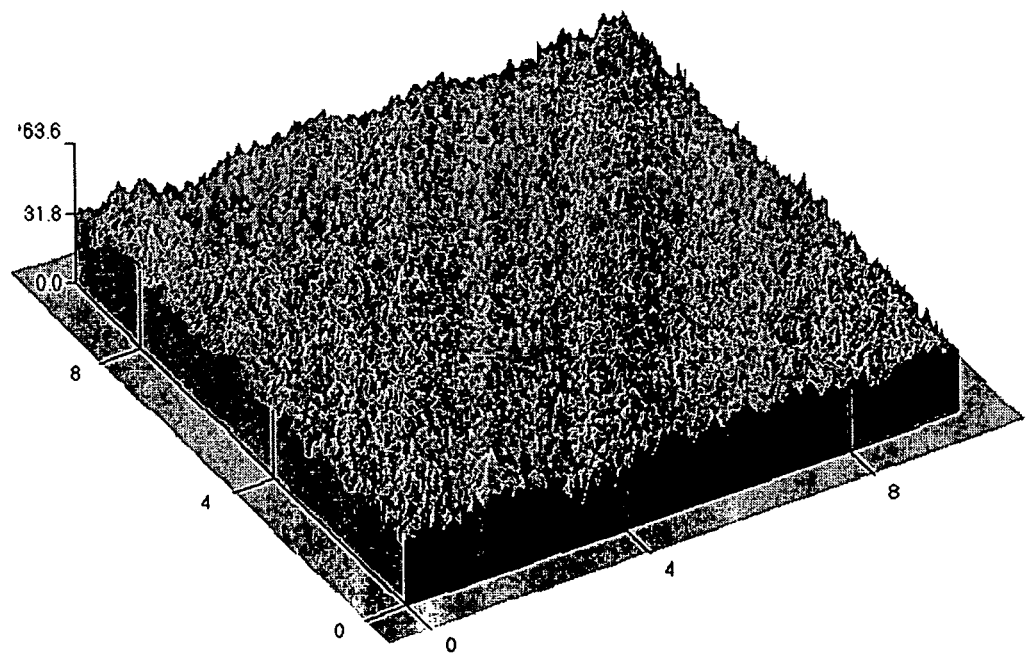
FIG. 2B is a photograph of the surface after surface-treating the buffer layer according to an exemplary embodiment of the present invention.

FIG. 2A is a photograph of the surface after forming a buffer layer, and FIG. 2B is a photograph of the surface after surface-treating the buffer layer.

In comparison with FIG. 2A, FIG. 2B illustrates that after the buffer layer is surface-treated, the surface roughness of the buffer layer increases.

Accordingly, by treating the surface of the buffer layer 130 interposed between the transfer layer 140 and the light-to-heat conversion layer 120, adhesion properties between the donor substrate and the transfer layer 140 are enhanced.

Referring to FIG. 1B, the transfer layer 140 is formed on the surface-treated buffer layer 130.

The transfer layer 140 of the donor substrate may be an emission layer (EML) of the organic light emitting device.

In addition, the transfer layer 140 of the donor substrate may further include at least one selected from the group consisting of a hole injection layer, a hole transport layer, a hole blocking layer, and an electron injection layer.

Figure 3:
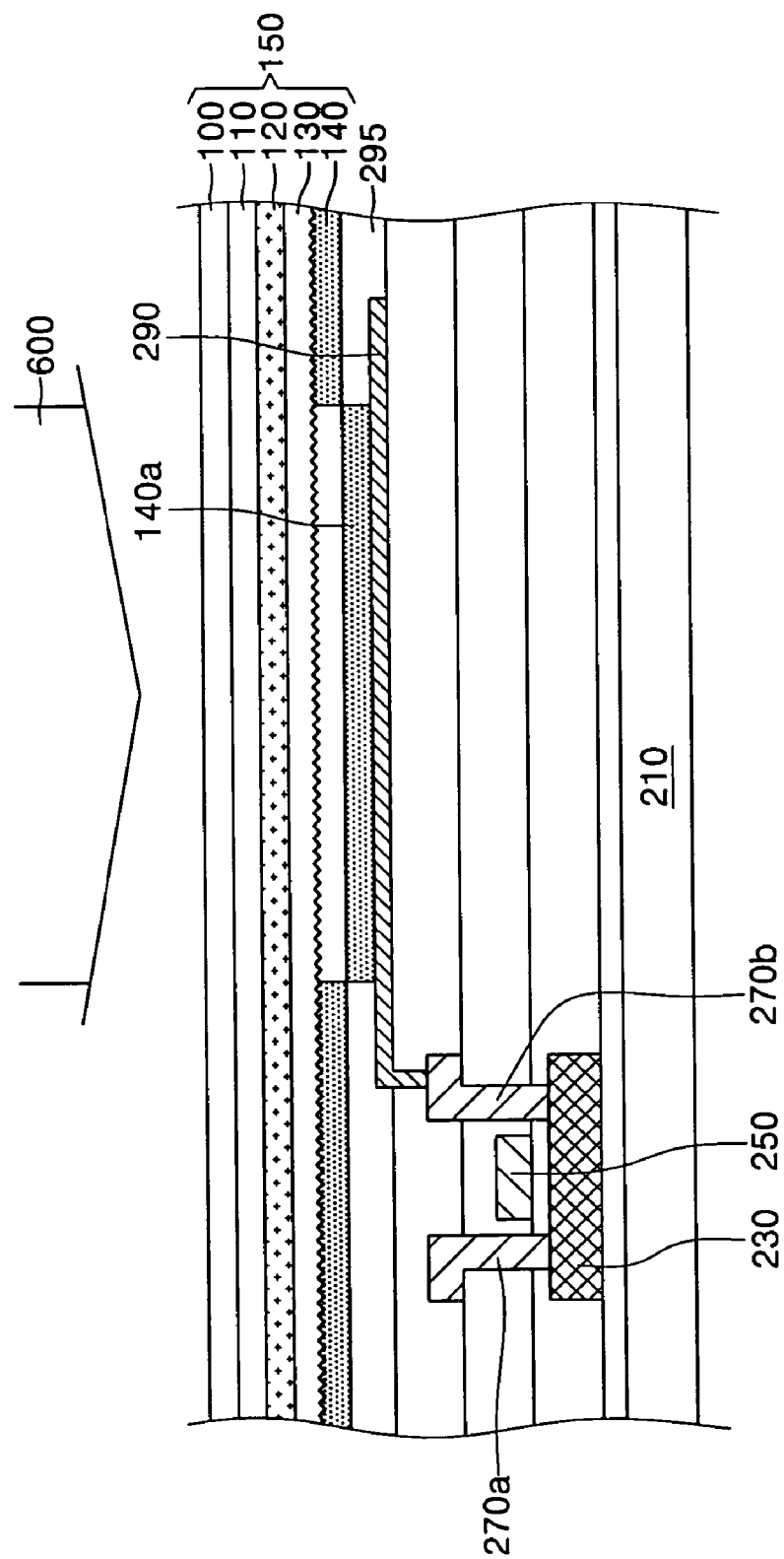
FIG. 3 is a cross-sectional view illustrating the process of performing an LITI method on a unit pixel of an organic light emitting display (OLED) using the donor substrate.

FIG. 3 is a cross-sectional view illustrating a process of performing an LITI method on a unit pixel of an organic light emitting display (OLED) using the above-described donor substrate.

Referring to FIG. 3, a donor substrate 150, which is fabricated by the above-described method according to the present invention, is disposed over a substrate 210 on which a thin-film transistor (TFT) and a pixel electrode 290 are formed.

Specifically, the TFT including a semiconductor layer 230, a gate electrode 250, a source electrode 270a, and a drain electrode 270b is disposed on the substrate 210, and the pixel electrode 290 is connected to one of the source and drain electrodes 270a and 270b of the TFT and exposed by a pixel defining layer 295.

Once an LITI process 600 is performed on the donor substrate 150, a transfer layer 140a is transferred to the exposed portion of the pixel electrode 290 so that an EML is patterned.

After the patterning process is finished, an opposite electrode is formed, thereby completing the OLED.

In the exemplary embodiments of the present invention as described above, a donor substrate is fabricated by interposing a surface-treated buffer layer between a transfer layer and a light-to-heat conversion layer, so that adhesion properties between the transfer layer and the light-to-heat conversion layer can be enhanced.

Further, by using the above-described donor substrate, a patterning process can be performed better during the fabrication of the OLED.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a donor substrate for a laser induced thermal imaging process, comprising:
    preparing a base substrate;
    forming a light-to-heat conversion layer on the base substrate;
    forming a buffer layer on the light-to-heat conversion layer;
    increasing surface roughness of the buffer layer; and
    forming a transfer layer on the surface-treated buffer layer.

2. The method according to claim 1, wherein the step of increasing surface roughness of the buffer layer is performed using oxygen ions or radical-based gases.

3. The method according to claim 1, wherein the base substrate is one of a flexible film, a plastic film, a hard substrate and a glass substrate.

4. The method according to claim 1, wherein the transfer layer of the donor substrate is for an emission layer of an organic light emitting device.

5. The method according to claim 4, wherein the transfer layer of the donor substrate further includes at least one selected from a group consisting of a hole injection layer, a hole transport layer, a hole blocking layer, and an electron injection layer.

6. The method according to claim 1, wherein the buffer layer is formed of a polymer, a metal, or metal oxide.

7. A method of transferring a pattern forming material to a target substrate, comprising:
   preparing a donor substrate by a process, the process comprising:
      preparing a base substrate;
      forming a light-to-heat conversion layer on the base substrate;
      forming a buffer layer on the light-to-heat conversion layer;
      increasing surface roughness of the buffer layer; and
      forming a transfer layer on the surface-treated buffer layer;
   irradiating laser beams on a predetermined region of the donor substrate, said laser beams converted into heat by the light-to-heat conversion layer to transform adhesion properties between the transfer layer and the light-to-heat conversion layer; and
   transferring the transfer layer to the target substrate.

8. The method according to claim 7, wherein the step of forming the donor substrate further comprises forming a primer layer on the base substrate, before forming the light-to-heat conversion layer.

9. The method according to claim 7, wherein the buffer layer is formed of a polymer, a metal, or metal oxide.

10. A method of transferring a pattern forming material to a target substrate, comprising:
   preparing a donor substrate, said donor substrate comprising a transfer layer, a light-to-heat conversion layer, and a surface-treated buffer layer interposed between said transfer layer and said light-to-heat conversion layer;
   irradiating laser beams on a predetermined region of the donor substrate, said laser beams converted into heat by the light-to-heat conversion layer to transform adhesion properties between the transfer layer and the light-to-heat conversion layer; and
   transferring the transfer layer to the target substrate.

11. The method according to claim 10, wherein the surface treatment of the buffer layer is performed using oxygen ions or radical-based gases.

12. The method according to claim 10, wherein the target substrate is included in a unit pixel of an organic light emitting display.

13. The method according to claim 12, wherein the transfer layer of the donor substrate further includes at least one selected from a group consisting of a hole injection layer, a hole transport layer, a hole blocking layer, and an electron injection layer.

* * * * *